US008054878B2

(12) United States Patent
Ahn (10) Patent No.: US 8,054,878 B2
(45) Date of Patent: Nov. 8, 2011

(54) APPARATUS AND METHOD FOR AMPLIFYING SIGNAL POWER IN A COMMUNICATION SYSTEM

(75) Inventor: Cheol-Woo Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 555 days.

(21) Appl. No.: 12/319,512

(22) Filed: Jan. 8, 2009

(65) Prior Publication Data

US 2009/0180530 A1    Jul. 16, 2009

(51) Int. Cl.
*H03K 9/08* (2006.01)
(52) U.S. Cl. ............................................. 375/238
(58) Field of Classification Search .................. 375/238, 375/237, 295, 297, 298, 319, 344, 345; 455/296, 455/324, 366, 306; 322/235
See application file for complete search history.

(56) References Cited

U.S. PATENT DOCUMENTS

| 6,868,128 | B1* | 3/2005 | Lane | 375/319 |
| 7,359,682 | B2* | 4/2008 | Yoon | 455/108 |
| 2003/0045249 | A1* | 3/2003 | Nielsen | 455/118 |
| 2007/0217559 | A1* | 9/2007 | Stott et al. | 375/355 |

* cited by examiner

*Primary Examiner* — Khai Tran (57) ABSTRACT

A transmitter is provided for amplifying signal power in a communication system. The transmitter includes a single-tone signal generator for generating a single-tone signal; a baseband signal generator for generating a baseband signal; a bias modulator for switching a positive bias signal to a first power amplifier using the baseband signal, and switching a negative bias signal to the second power amplifier using the baseband signal; the first power amplifier for power-amplifying the single-tone signal using the positive bias signal; and the second power amplifier for power-amplifying the single-tone signal using the negative bias signal.

13 Claims, 9 Drawing Sheets

FIG.1
(PRIOR ART)

(a) BASEBAND SIGNAL (LOW-FREQUENCY SINE WAVE)

(b) MAGNITUDE OF SIGNAL (a)-AMPLITUDE (ENVELOPE)

FIG.2A
(PRIOR ART)

(c) PHASE SIGNAL OF SIGNAL (a)

(d) PHASE-MODULATED SIGNAL OF SIGNAL (c)

FIG.2B
(PRIOR ART)

(e) SIGNAL DISTORTED DUE TO BAND LIMIT (f) NORMAL OUTPUT SIGNAL OF POWER AMPLIFIER

(a) BASEBAND SIGNAL (LOW-FREQUENCY SINE WAVE)

(b) CARRIER-MODULATED SIGNAL

FIG.5A (c) OUTPUT SIGNAL OF POWER AMPLIFIER (d) OUTPUT SIGNAL OF MAIN AMPLIFIER (POSITIVE)

FIG.5B (e) OUTPUT SIGNAL OF MAIN AMPLIFIER (NEGATIVE)

FIG.5C

APPARATUS AND METHOD FOR AMPLIFYING SIGNAL POWER IN A COMMUNICATION SYSTEM

CROSS-REFERENCE TO RELATED APPLICATION(S) AND CLAIM OF PRIORITY

The present application claims the benefit under 35 U.S.C. §119(a) of a Korean patent application filed in the Korean Intellectual Property Office on Jan. 11, 2008 and assigned Serial No. 10-2008-0003672, the entire disclosure of which is hereby incorporated by reference.

TECHNICAL FIELD OF THE INVENTION

The present invention relates generally to a communication system and, in particular, to an apparatus and method for amplifying signal power in a communication system.

BACKGROUND OF THE INVENTION

A communication system has a power amplifier, included in a transmitter, for amplifying transmission signals during signal transmission, and the transmitter power-amplifies transmission signals by means of the power amplifier and transmits the power-amplified signals.

Currently, communication systems are increasingly evolving, and due to the evolution of communication systems, the transmitter increasingly requires use of broadband signals. In addition, communication systems require a high Peak-to-Average Ratio (PAR) of transmission signals according to signal transmission. Therefore, a power amplifier included in the transmitter requires higher linearity and higher efficiency.

Power amplification schemes used for the power amplifier are classified into a Doherty scheme, an Envelope Elimination and Restoration (EER) scheme, a Delta-Sigma Modulation (DSM) scheme, and a Linear amplification using Nonlinear Component (LINC) scheme.

Figure 1:
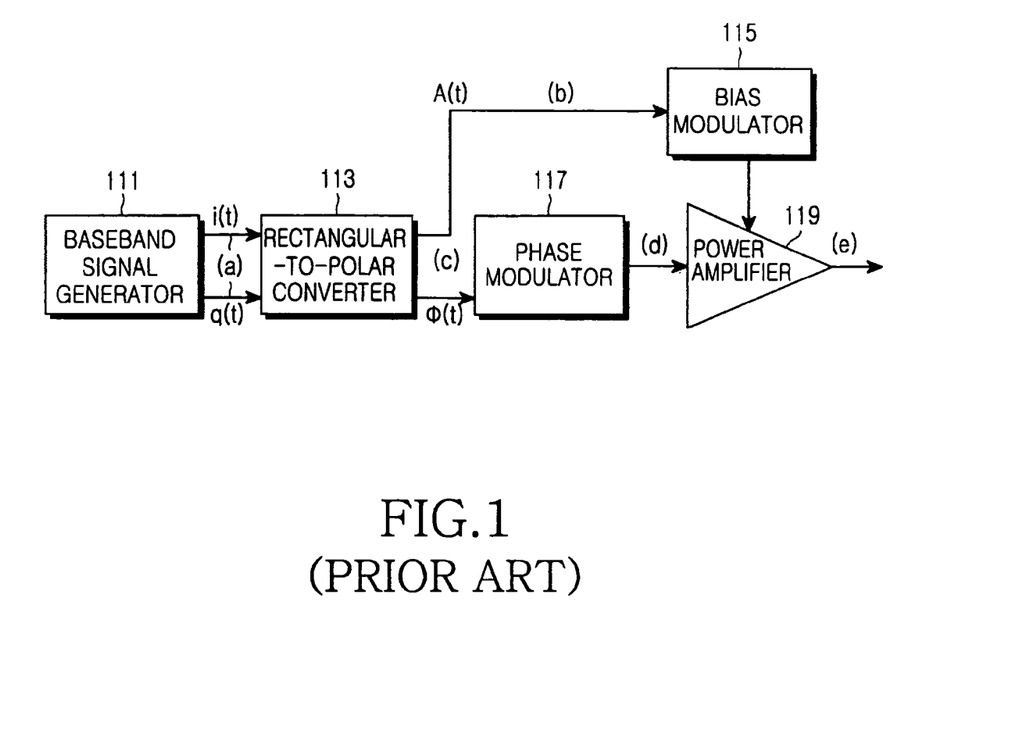
FIG. 1 is a diagram illustrating a structure of a transmitter using an EER scheme in a conventional communication system.

Of the power amplification schemes, the Doherty scheme and the EER scheme are superior in terms of efficiency, and the DSM scheme and the LINC scheme are superior in terms of linearity. Further, the EER scheme uses signals of polar components without using rectangular (IQ) signals (i.e, signals having a 90°-phase difference between an In-phase (I) component and a Quadrature (Q) component), which are represented by I and Q components. The EER scheme uses, as an input to a power amplifier, phase components of signals having a constant envelope after undergoing envelope elimination. In addition, the EER scheme modulates direct current (DC) bias of a switch mode or a saturation power amplifier for envelope restoration. With reference to FIG. 1, a description will now be made of the EER scheme.

FIG. 1 is a diagram illustrating a structure of a transmitter using an EER scheme in a conventional communication system.

Referring to FIG. 1, the transmitter includes a baseband signal generator 111, a rectangular-to-polar converter 113, a bias modulator 115, a phase modulator 117, and a power amplifier 119.

The baseband signal generator 111 generates rectangular (IQ) signals of a baseband using voice signals or data.

The rectangular-to-polar converter 113 converts the rectangular signals into polar signals which are divided into amplitude components and phase components.

The bias modulator 115, which supplies power (i.e., voltage or current) to a power amplifier, supplies voltage or current components corresponding to signals of the amplitude components to the power amplifier 119.

The phase modulator 117 performs phase modulation to generate radio frequency (RF) signals of a desired frequency band using the signals of the phase components.

Figure 2A:
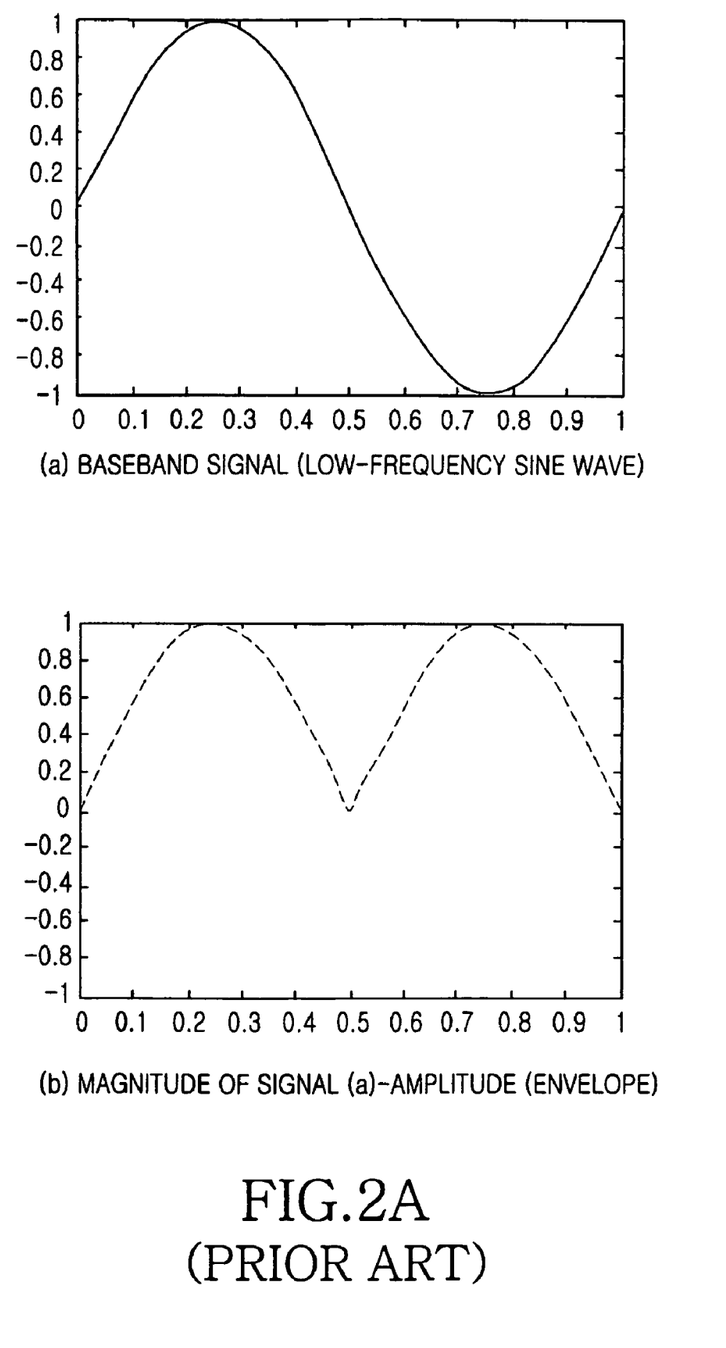
FIGS. 2A to 2C are graphs illustrating internal signals of a transmitter using an EER scheme in a general communication system.
Figure 2B:
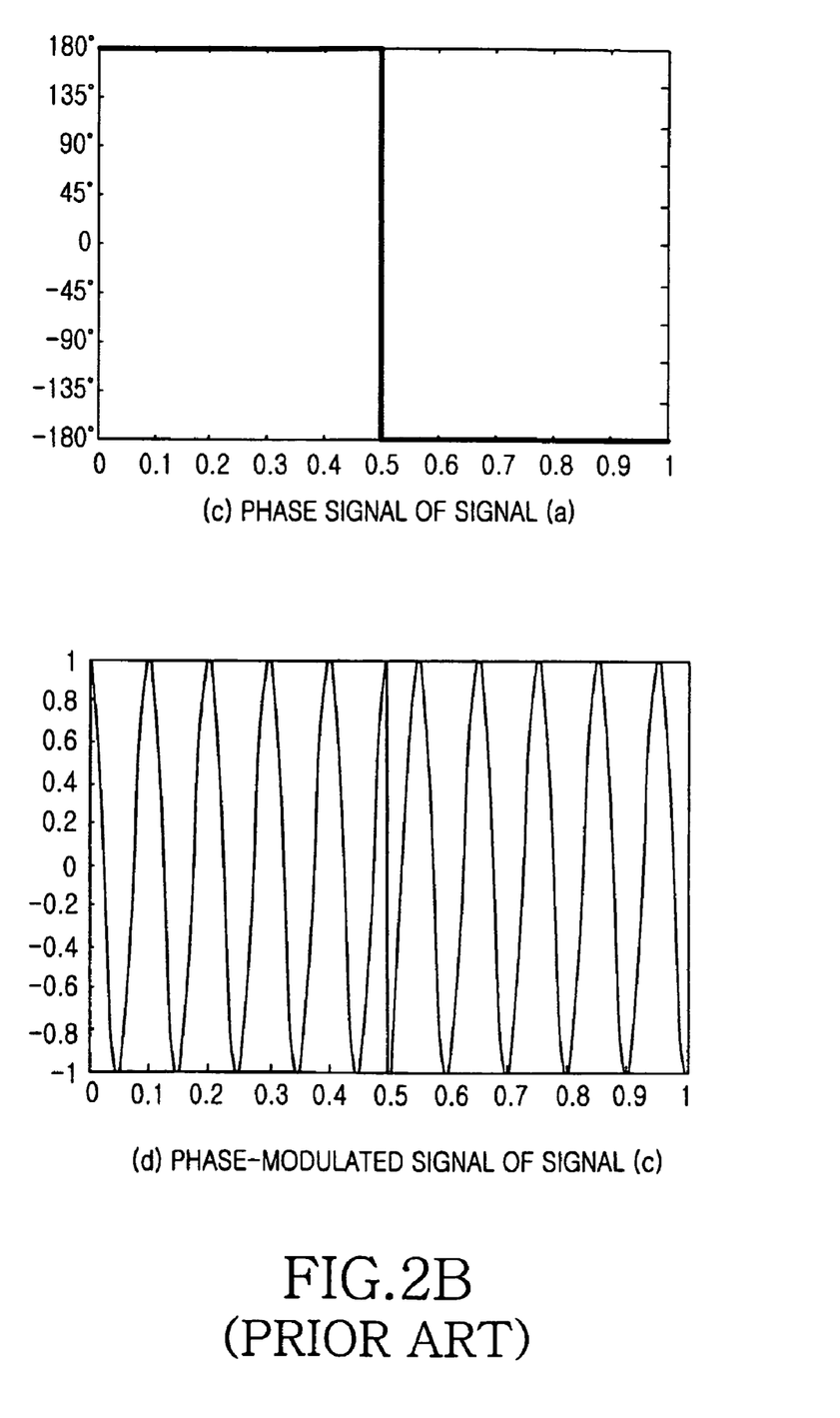
Figure 2C:
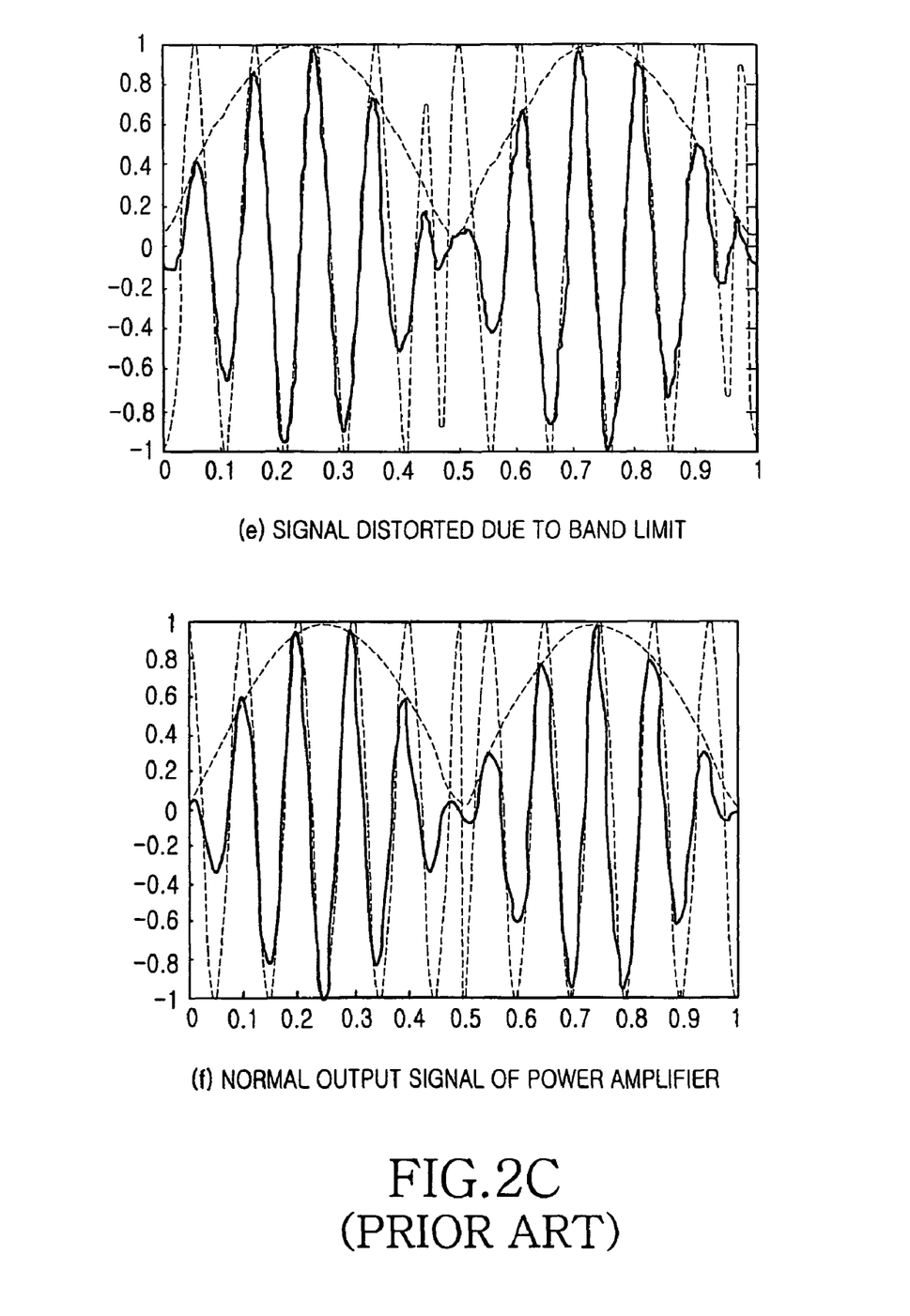

The power amplifier 119 receives the signals phase-modulated by the phase modulator 117, amplifies the power of transmission signals, and combines amplitude components depending on a change in a bias voltage by the amplitude components generated by the bias modulator 115 to thereby restore the original signals. Since an input to the power amplifier 119 has a constant envelope and there is no distortion for an input signal even though a switch mode or a saturation power amplifier is used, the power amplifier 119 has a high-efficiency characteristic. With reference to FIGS. 2A to 2C, a description will now be made of internal signals of a transmitter using the EER scheme.

FIGS. 2A to 2C are graphs illustrating internal signals of a transmitter using an EER scheme in a general communication system.

Before a description of FIGS. 2A to 2C is given, it is assumed that baseband signals used in the present invention use sine waves of a low-frequency band. In each graph, the horizontal axis represents time, and the vertical axis represents the amplitude of signals. For example, referring to FIG. 2A, shown is a sine wave signal having an amplitude '1' and a period '1'.

Referring to FIG. 2A, shown are an output signal (a) of a baseband signal generator in a transmitter, and an output signal (b) corresponding to an amplitude component obtained by converting a polar of the signal 'a' by a rectangular-to-polar converter in the transmitter.

The signal 'a' is a low-frequency sine wave signal, and the signal 'b' is an envelope signal, which is an amplitude signal of the signal output from the rectangular-to-polar converter.

Referring to FIG. 2B, shown are an output signal (c) corresponding to a phase component obtained by polar-converting the signal 'a' by the rectangular-to-polar converter in the transmitter, and a signal (d) obtained by phase-modulating the signal 'c' by a phase modulator in the transmitter. The vertical axis of the graph showing the signal 'c' represents a phase. The signal 'd' is a phase signal which is modulated with a carrier signal having a frequency which is approximately 10 times higher than a baseband signal of low-frequency sine waves.

Referring to FIG. 2C, shown are an abnormal output signal (e) of a power amplifier in the transmitter, and a normal output signal (f) of the power amplifier.

The signal 'e' is a signal distorted due to the band limit, and the signal 'f' is a signal that should be normally output from the power amplifier.

Since the transmitter using the EER scheme converts the rectangular signal into the polar signal, the amplitude components and the phase components have more high-frequency components than the original signals. Therefore, the bias modulator should have an operating bandwidth which is, for example, 2 to 5 times that of the baseband signal, and the power amplifier should have an operating bandwidth which is, for example, 5 to 20 times that of the baseband signal. Thus, the transmitter using the EER scheme increases the operating bandwidth of each hardware module in the transmitter.

In addition, as the operating bandwidth increases, the transmitter using the EER scheme increases in non-linearity caused by the transmission signal's power amplification due to the limitation on implementing a digital-to-analog converter (DAC) and the limitation on implementing the bias modulator because of the limit and loss of switching frequency of the switching elements.

SUMMARY OF THE INVENTION

To address the above-discussed deficiencies of the prior art, it is a primary aspect of the present invention to address at least the problems and/or disadvantages and to provide at least the advantages described below. Accordingly, an aspect of the present invention is to provide an apparatus and method for amplifying the signal power in a communication system.

Another aspect of the present invention is to provide a signal power amplification apparatus and method in which operating bandwidths of hardware modules in a transmitter are reduced in a communication system.

Further another aspect of the present invention is to provide a signal power amplification apparatus and method for preventing an increase in non-linearity in a communication system.

According to one aspect of the present invention, there is provided a method for amplifying signal power by a transmitter including a first power amplifier and a second power amplifier in a communication system. The method includes generating a baseband signal and a single-tone signal; generating a positive bias signal by swinging a positive voltage component of the baseband signal; and generating a negative bias signal by swinging a negative voltage component of the baseband signal, power-amplifying, at the first power amplifier, the single-tone signal using the positive bias signal, and power-amplifying, at the second power amplifier, the single-tone signal using the negative bias signal.

According to another aspect of the present invention, there is provided an apparatus for amplifying signal power in a communication system. The apparatus includes a single-tone signal generator for generating a single-tone signal; a baseband signal generator for generating a baseband signal; a bias modulator for switching a positive bias signal to a first power amplifier using the baseband signal, and switching a negative bias signal to the second power amplifier using the baseband signal; the first power amplifier for power-amplifying the single-tone signal using the positive bias signal; and the second power amplifier for power-amplifying the single-tone signal using the negative bias signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 3 through 5C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

The present invention provides an apparatus and method for amplifying signal power in a communication system. In particular, the present invention provides a signal power amplification apparatus and method in which operating bandwidths of hardware modules in a transmitter are reduced and non-linearity is reduced in a communication system.

The signal power amplification method of the present invention can be applied to a transmitter of a conventional communication system, for example, to a base station (BS) or mobile station (MS).

Figure 3:
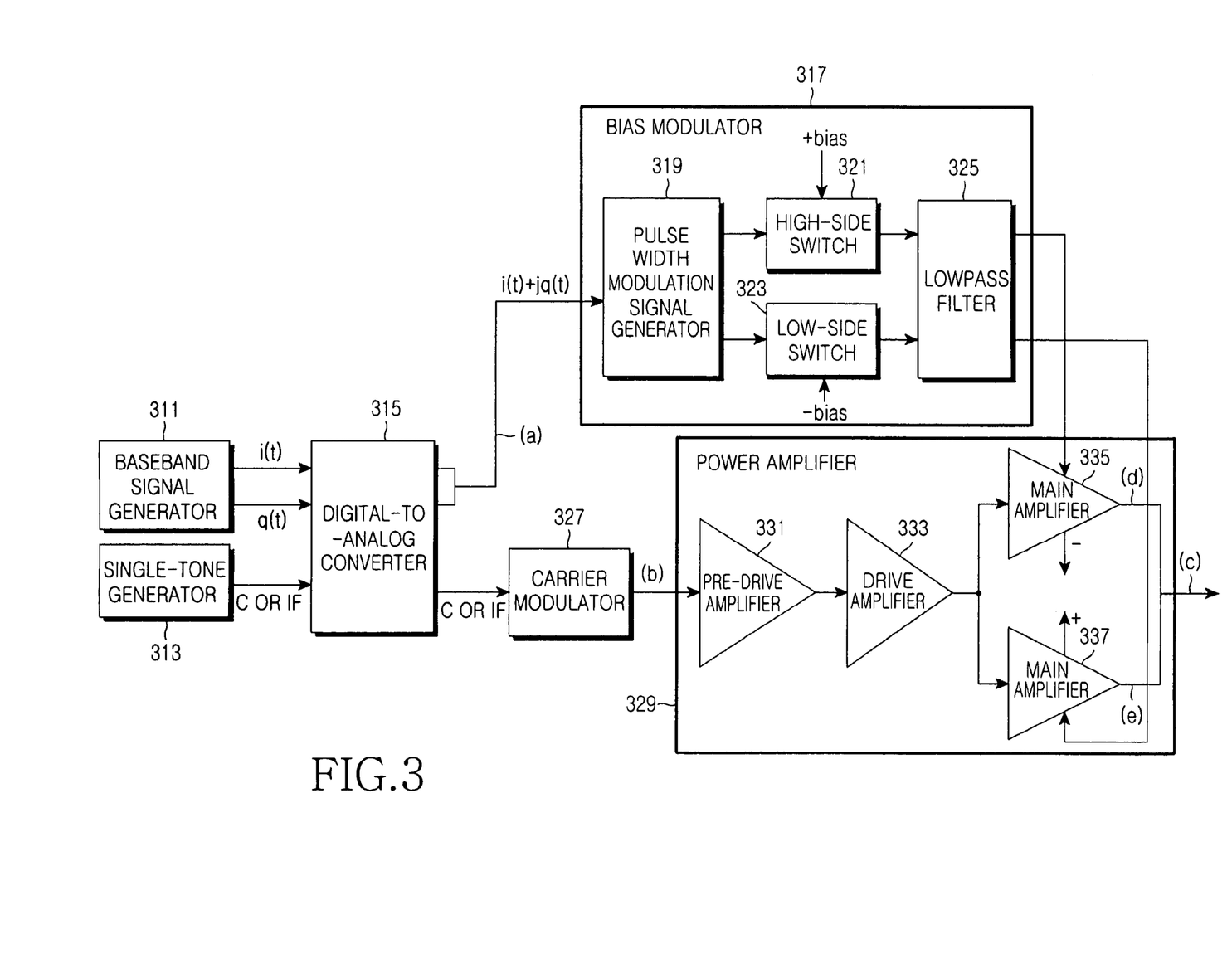
FIG. 3 is a diagram illustrating a structure of a transmitter using a power amplification scheme based on a first embodiment of the present invention.
Figure 4:
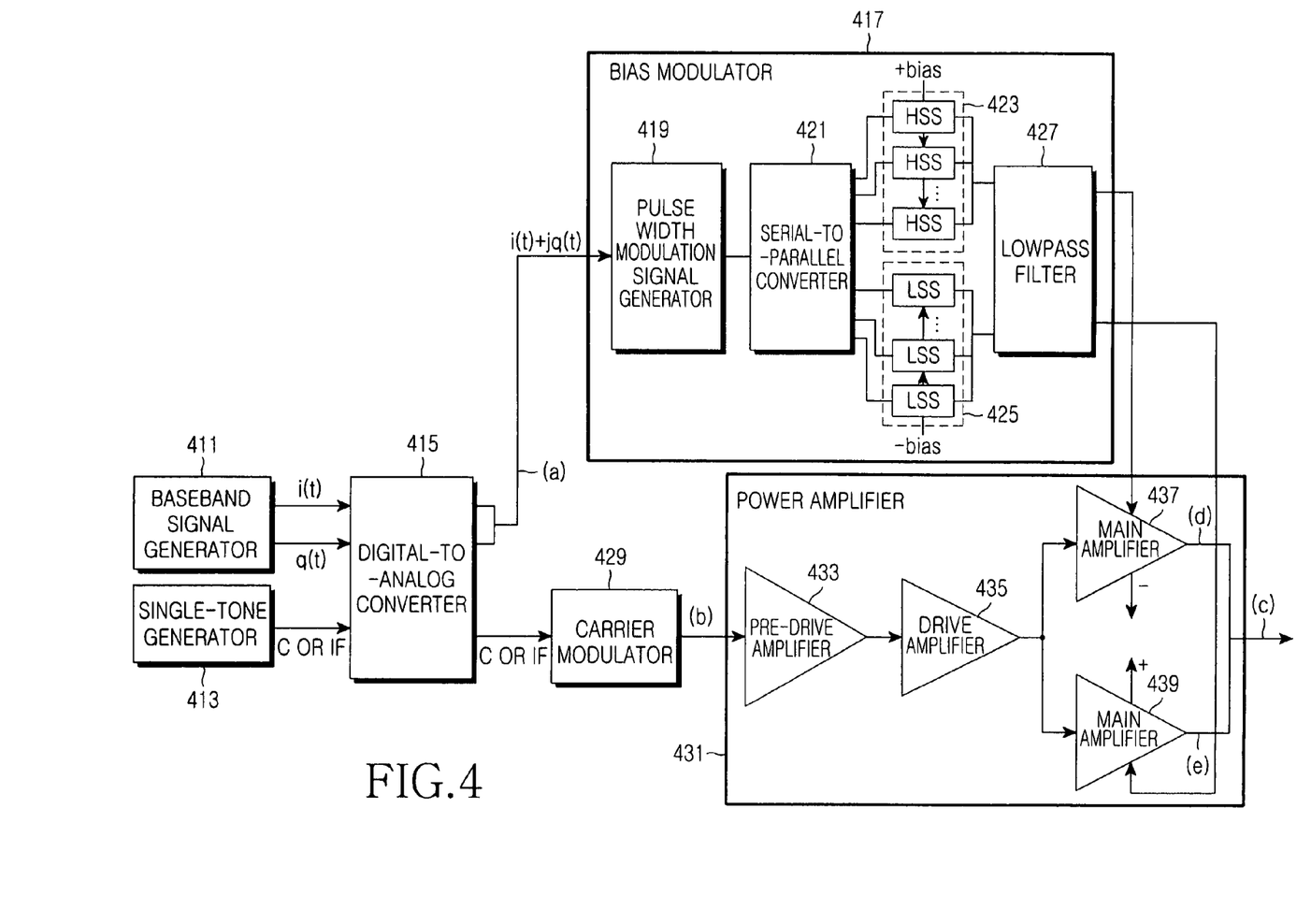
FIG. 4 is a diagram illustrating a structure of a transmitter using a power amplification scheme based on a second embodiment of the present invention.

With reference to FIGS. 3 and 4, a description will now be made of a structure of a transmitter in a communication system according to the present invention.

FIG. 3 is a diagram illustrating a structure of a transmitter using a power amplification scheme based on a first embodiment of the present invention.

Referring to FIG. 3, a transmitter includes a baseband signal generator 311, a single-tone generator 313, a digital-to-analog converter 315, a bias modulator 317, a carrier modulator 327, and a power amplifier 329.

The baseband signal generator 311 generates a baseband signal including an in-phase (I) component and a quadrature (Q) component having a 90°-phase difference. The baseband signal generated by the baseband signal generator 311 is a digital signal.

The single-tone generator 313 generates a single-tone signal for carrier modulation (for example, a constant signal having a fixed amplitude or an intermediate frequency (IF) signal). The IF signal generated by the single-tone generator 313 can be, for example, an IF sine wave signal. The single-tone signal generated by the single-tone generator 313 is a digital signal.

The digital-to-analog converter 315 converts the baseband signal generated by the baseband signal generator 311 and the single-tone signal generated by the single-tone generator 313, respectively, into analog signals.

The carrier modulator 327 modulates the analog-converted single-tone signal with a high-frequency carrier signal. For example, when the single-tone signal is an IF sine wave signal, the carrier modulator 327 modulates the single-tone signal with a high-frequency sine wave signal. The single-tone signal which is modulated with the high-frequency signal by the carrier modulator 327 will be referred to herein as a 'carrier modulated signal'.

The bias modulator 317 supplies a bias power to the power amplifier 329 in response to the amplitude of the analog-converted baseband signal. The term 'bias power' as used herein refers to a voltage and current for an operation of the power amplifier 329. Through the voltage and current supplied by the bias modulator 317, modulation for signal restoration is possible in the power amplifier 329.

The baseband signal provided from the digital-to-analog converter 315 to the bias modulator 317 has both positive voltage components and negative voltage components. Therefore, the bias modulator 317 requires an operation of swinging the positive voltage components of the baseband signal, and an operation of swinging the negative voltage components of the baseband signal. By these operations, the bias modulator 317 generates a positive bias signal and a negative bias signal, and provides the positive bias signal and the negative bias signal as a bias power for the power amplifier 329.

The bias modulator 317 includes a pulse width modulation signal generator 319, a high-side switch 321, a low-side switch 323, and a low-pass filter (LPF) 325.

The pulse width modulation signal generator 319 generates a pulse width modulated signal using the analog-converted baseband signal. The pulse width modulated signal generated by the pulse width modulation signal generator 319 is a signal used for controlling the high-side switch 321 and the low-side switch 323, respectively.

Operations of the high-side switch 321 and the low-side switch 323 are as follows.

The amplitude of the pulse width modulated signal generated by the pulse width modulation signal generator 319 is output as a positive voltage value and a negative voltage value. When a positive voltage signal is output from the pulse width modulation signal generator 319, the high-side switch 321 operates to output the positive bias signal applied to the switch, and when a negative voltage signal is output from the pulse width modulation signal generator 319, the low-side switch 323 operates to output the negative bias signal applied to the switch, thereby outputting both the positive voltage components and the negative voltage components of the baseband signal.

The low-pass filter 325 outputs a negative bias power and a positive bias power by low-pass filtering the signals output from the high-side switch 321 and the low-side switch 323. The negative bias power and positive bias power output from the low-pass filter 325 correspond to restoration of the original signal. The low-pass filter 325 can be composed of, for example, inductors and capacitors.

The power amplifier 329 power-amplifies the carrier modulated signal using the positive bias signal and the negative bias signal.

The power amplifier 329 includes a pre-drive amplifier 331, a drive amplifier 333, a first main amplifier 335, and a second main amplifier 337. The first main amplifier 335 and the second main amplifier 337 are power amplification elements for performing actual power amplification in the power amplifier 329, and are generally referred to a 'power amplifier'. For convenience, however, they are referred to herein as a first main amplifier 335 and a second main amplifier 337.

The pre-drive amplifier 331 primarily power-amplifies the carrier modulated signal provided from the carrier modulator 327, and outputs a carrier modulated signal amplified to a predetermined amplitude.

The drive amplifier 333 secondarily power-amplifies the carrier modulated signal primarily power-amplified by the pre-drive amplifier 331, and outputs a carrier modulated signal amplified to a predetermined amplitude.

In many cases, since the first main amplifier 335 and the second main amplifier 337 have a structure incapable of having sufficient power gain, the pre-drive amplifier 331 and the drive amplifier 333 output signals which are power-amplified to a predetermined amplitude so that the power amplifiers can amplify signals with sufficient power. Both the pre-drive amplifier 331 and the drive amplifier 333 can be used, or only one of the pre-drive amplifier 331 and the drive amplifier 333 can be used. The pre-drive amplifier 331 and the drive amplifier 333 correct the power gain of the first main amplifier 335 and the second main amplifier 337.

In the present invention, the power amplifier 329 uses two main amplifiers. That is, the power amplifier 329 proposed by the present invention includes at least one main amplifier to which a positive bias signal is applied and at least one main amplifier to which a negative bias signal is applied.

To an input terminal of the first main amplifier 335 is input the carrier modulated signal power-amplified by the drive amplifier 333, and to a bias terminal is input the positive bias signal from the bias modulator 317.

The first main amplifier 335 amplifies and modulates the carrier modulated signal power-amplified by the drive amplifier 333 using the positive bias signal provided by the bias modulator 317. The modulation by the first main amplifier 335 corresponds to frequency modulation in a positive bias region. That is, the first main amplifier 335 outputs a modulated signal (hereinafter referred to as a 'positive-region modulated signal') obtained by changing a frequency of the carrier modulated signal power-amplified by the drive amplifier 333 according to the amplitude of the positive bias signal provided by the bias modulator 317.

To an input terminal of the second main amplifier 337 is input the carrier modulated signal power-amplified by the drive amplifier 333, and to a bias terminal is input the negative bias signal from the bias modulator 317.

The second main amplifier 337 amplifies and modulates the carrier modulated signal power-amplified by the drive amplifier 333 using the negative bias signal provided by the bias modulator 317. The modulation by the second main amplifier 337 corresponds to frequency modulation in a negative bias region. That is, the second main amplifier 337 outputs a modulated signal (hereinafter referred to as a 'negative-region modulated signal') obtained by changing a frequency of the carrier modulated signal power-amplified by the drive amplifier 333 according to amplitude of the negative bias signal provided from the bias modulator 317.

As stated above, the first main amplifier 335 and the second main amplifier 337 perform amplification and/or modulation on the carrier modulated signals in the positive bias region and the negative bias region, respectively. Meanwhile, the combined modulated signal of the positive-region modulated signal output from the first main amplifier 335 and the negative-region modulated signal output from the second main amplifier 337 is output as the final signal of the power amplifier 329.

The power amplifier 329 in the present invention receives a constant envelope signal as in the general EER scheme. However, the power amplifier 329 in the present invention can have a high-efficiency characteristic through a bias input that operates in a switch mode.

FIG. 4 is a diagram illustrating a structure of a transmitter using a power amplification scheme based on a second embodiment of the present invention.

Referring to FIG. 4, the transmitter includes a baseband signal generator 411, a single-tone generator 413, a digital-to-analog converter 415, a bias modulator 417, a carrier modulator 429, and a power amplifier 431.

The bias modulator 417 includes a pulse width modulation signal generator 419, a serial-to-parallel converter 421, at least two high-side switches 423, at least two low-side switches 425, and a low-pass filter 427.

The power amplifier 431 includes a pre-drive amplifier 433, a drive amplifier 435, a first main amplifier 437, and a second main amplifier 439.

This transmitter is different from the transmitter shown in FIG. 3 in terms of the structure of the bias modulator 417.

For the operations of devices such as the baseband signal generator 411, the single-tone generator 413, the digital-to-analog converter 415, the carrier modulator 429, and the power amplifier 431 of FIG. 4, reference will be made to the description of the transmitter structure of FIG. 3, and a detailed description thereof will be omitted herein.

The bias modulator 417 supplies a bias power to the power amplifier 431 in response to the amplitude of the analog-converted baseband signal. The term 'bias power' as used herein refers to a voltage and current for an operation of the power amplifier 431. Through the voltage and current supplied by the bias modulator 417, modulation for signal restoration is possible in the power amplifier 431.

The baseband signal provided by the digital-to-analog converter 415 to the bias modulator 417 has both positive voltage components and negative voltage components. Therefore, the bias modulator 417 requires an operation of swinging the positive voltage components of the baseband signal, and an operation of swinging the negative voltage components of the baseband signal. By these operations, the bias modulator 417 generates a positive bias signal and a negative bias signal, and provides the positive bias signal and the negative bias signal as a bias power for the power amplifier 431.

The bias modulator 417 includes the pulse width modulation signal generator 419, the serial-to-parallel converter 421, the high-side switches 423, the low-side switches 425, and the low-pass filter 427.

The pulse width modulation signal generator 419 generates a pulse width modulated signal using the analog-converted baseband signal. The pulse width modulated signal generated by the pulse width modulation signal generator 419 is a signal used for controlling the high-side switches 423 and the low-side switches 425.

The serial-to-parallel converter 421 converts the pulse width modulated signal generated by the pulse width modulation signal generator 419 into a parallel signal. An operation of the serial-to-parallel converter 421 is as follows. The serial-to-parallel converter 421 time-divides the pulse width modulated signal generated by the pulse width modulation signal generator 419, and sequentially provides them to the high-side switches 423 and the low-side switches 425. This makes it possible to use switches having a low-capacity, high-speed switching characteristic by operating the switches for a shorter time as compared with the original pulse width modulated signal.

Operations of the high-side switches 423 and the low-side switches 425 are as follows. The amplitude of the pulse width modulated signal generated by the pulse width modulation signal generator 419 is output as a positive voltage value and a negative voltage value. When a positive voltage signal is output from the pulse width modulation signal generator 419, the high-side switches 423 operate to output a positive bias signal applied to the switches, and when a negative voltage signal is output from the pulse width modulation signal generator 419, the low-side switches 425 operate to output a negative bias signal applied to the switches, thereby outputting both the positive voltage components and the negative voltage components of the baseband signal.

The low-pass filter 427 outputs a negative bias power and a positive bias power by low-pass filtering the positive pulse width modulated signal output from the high-side switches 423 and the negative pulse width modulated signal output from the low-side switches 425. The negative bias power and the positive bias power output from the low-pass filter 427 correspond to restoration of the original signal. The low-pass filter 427 can be composed of, for example, inductors and capacitors.

Output signals of the multiple high-side switches 423 are input to the low-pass filter 427 after being combined, and output signals of the multiple low-side switches 425 are input to the low-pass filter 427 after being combined.

The power amplifier 431 power-amplifies the carrier modulated signal using the positive bias signal and the negative bias signal.

When the high-side switches 423 and low-side switches 425 do not have sufficient switching speed, the bias modulator 417 uses the serial-to-parallel converter 421, and the high-side switches 423 and low-side switches 425 are constructed in parallel according to the outputs of the serial-to-parallel converter 421 so that they have a sufficient switching speed.

Figure 5A:
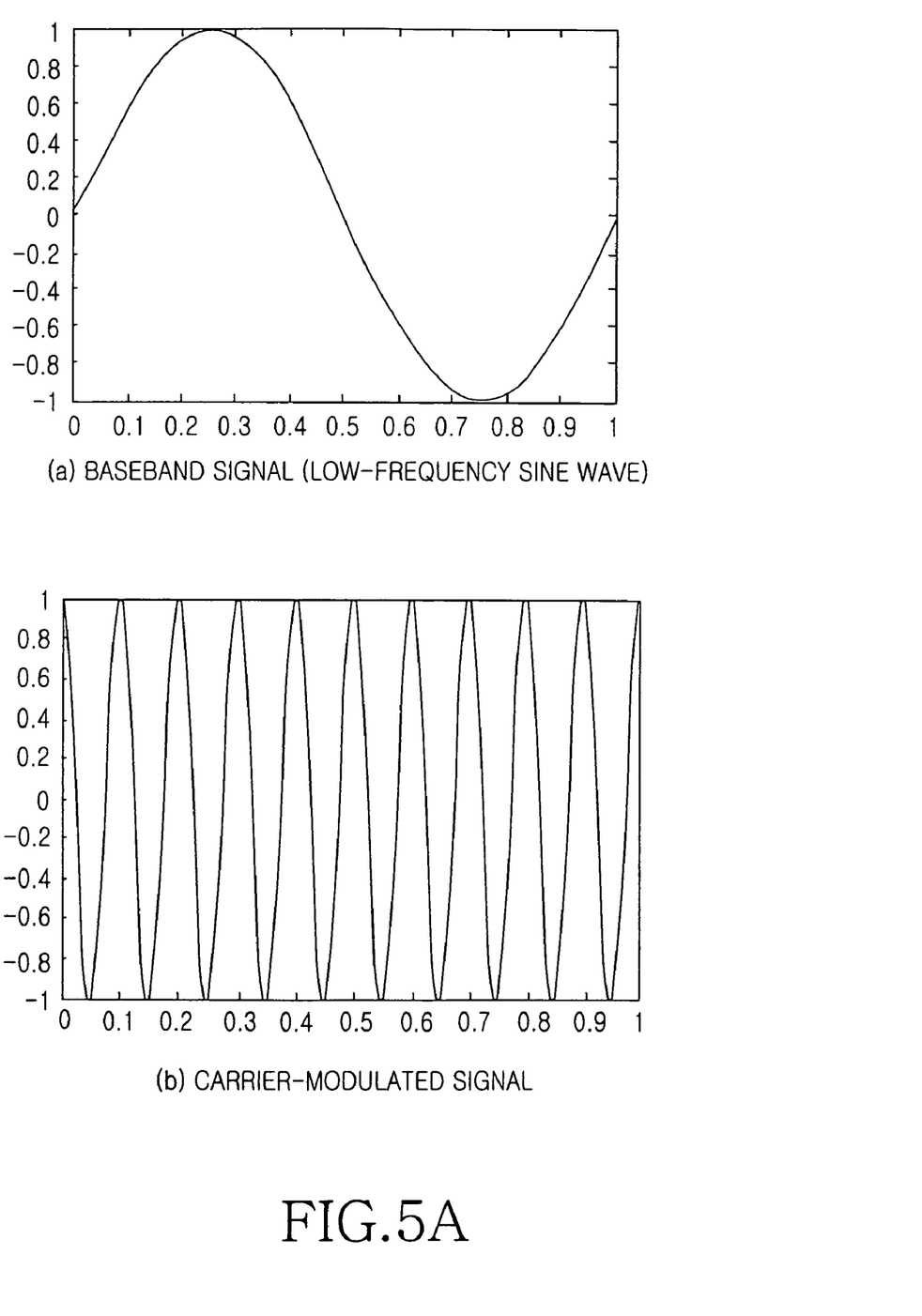
FIGS. 5A to 5C are graphs illustrating internal signals of a transmitter using a power amplification scheme in a communication system according to an embodiment of the present invention.
Figure 5B:
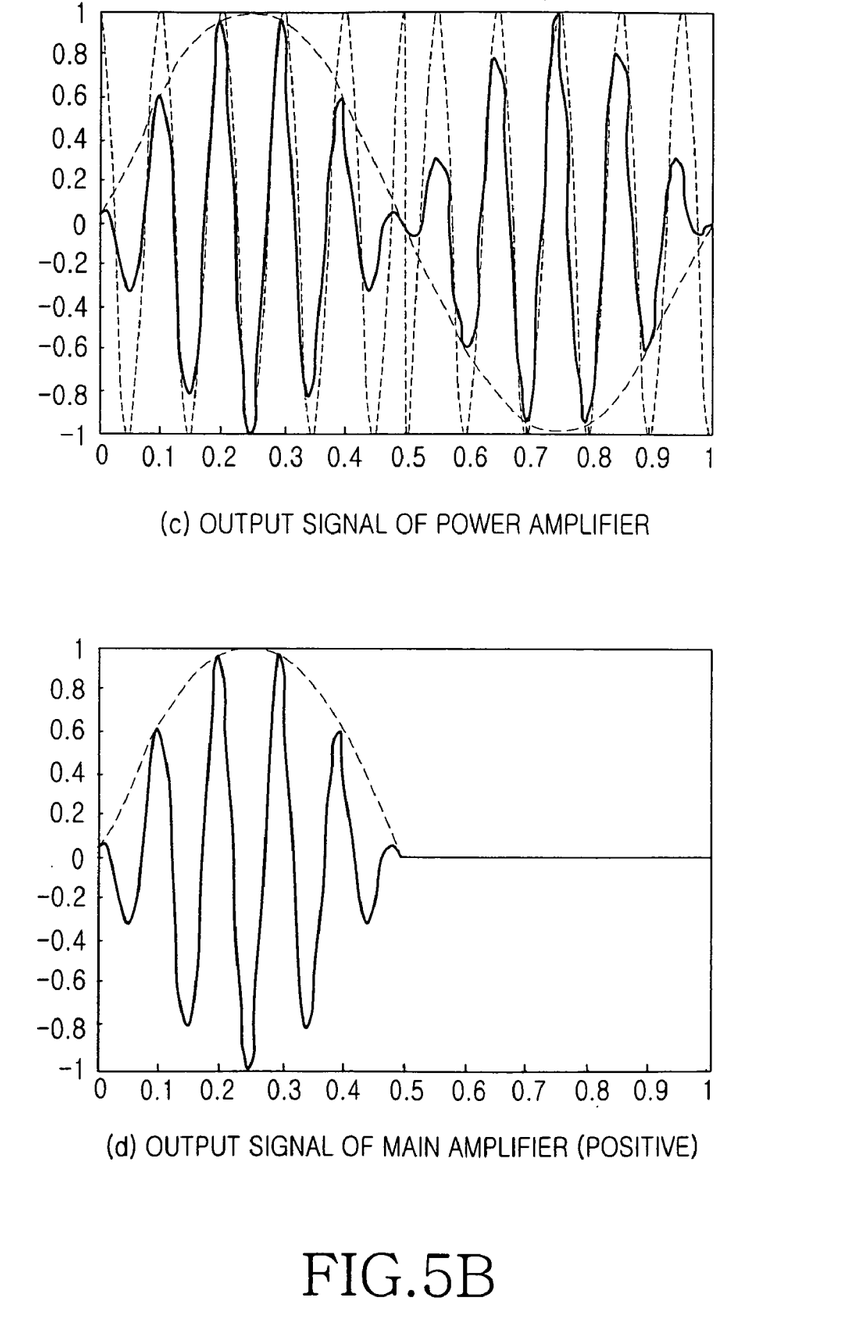
Figure 5C:
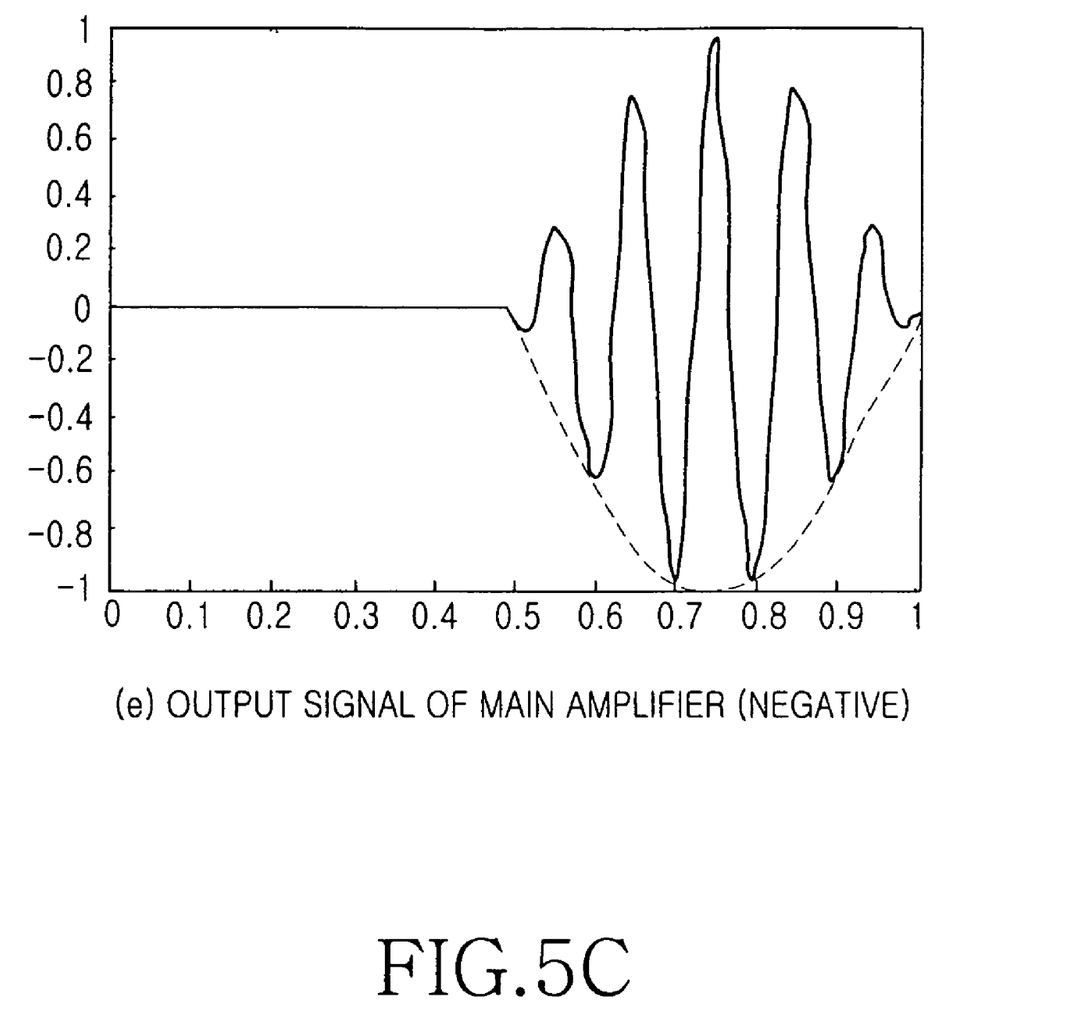

FIGS. 5A to 5C are graphs illustrating internal signals of a transmitter using a power amplification scheme in a communication system according to an embodiment of the present invention.

In each graph, the horizontal axis represents time, and the vertical axis represents the amplitude of signals.

In describing FIGS. 5A to 5C, it is assumed that baseband signals used in the present invention use sine waves of a low-frequency band.

Referring to FIG. 5A, shown are an output signal (a) of a baseband signal generator in the transmitter, and an output signal (b) obtained by modulating an analog-converted single-tone signal with a high-frequency signal by a carrier modulator in the transmitter.

Since the signal 'a' is a sine wave signal, it is modulated with a high-frequency sine wave signal.

Referring to FIG. 5B, shown are an output signal (c) power-amplified by a power amplifier in the transmitter, and an output signal (d) power-amplified by a first main amplifier in the transmitter.

Referring to FIG. 5C, there is shown a signal (e) power-amplified by a second main amplifier in the transmitter.

In conclusion, use of the transmitter according to the present invention makes it possible to generate the signal 'c' of FIG. 5B, which is equal to a desired signal 'f' through power amplification of FIG. 2.

As the present invention uses the baseband signal as an input signal to the bias modulator, the input signal includes not only the positive voltage components but also the negative voltage components. Thus, both the positive voltage signal and the negative voltage signal are applied to the power amplifier. In addition, the power amplifier of the present invention receives only the single-tone signal, and includes the first power amplifier to which the positive bias signal is applied and the second power amplifier to which the negative bias signal is applied, to power-amplify transmission signals.

The bias modulator of the present invention, as it uses the baseband signal, does not need an operating bandwidth which is 2 to 5 times the operating bandwidth for processing envelope signals. Therefore, the operating bandwidth is not increased during implementation of the bias modulator. In addition, since the power amplifier of the present invention receives the single-tone signal in which no phase component is included, the power amplifier does not need an operating bandwidth which is 5 to 20 times that of the baseband signal. Thus, the operating bandwidth is not increased during implementation of the power amplifier. As a result, it is possible to construct the transmitter of the present invention in which the bias modulator and the power amplifier have higher efficiency. In addition, according to the present invention, non-linearity is not increased because there is no limitation on implementing the digital-to-analog converter due to the non-increase in the operating bandwidth, and there is no limitation on implementing the bias modulator due to the limit and loss of switching frequency of the switching elements. Further, there is no need to correctly position-match the signal being input to the power amplifier of the present invention to the bias signal being input to the power amplifier. Therefore, the transmitter of the present invention does not need a separate operation for time alignment.

As is apparent from the foregoing description, in the communication system of the present invention, the transmitter includes power amplifiers to which a positive bias signal and a negative bias signal, for which the baseband signal is used, are applied. In addition, the single-tone signal is applied to the power amplifiers. Since the present invention generates bias signals using the baseband signal, an operating bandwidth of the bias modulator does not increase. Also, since the power amplifiers receive the single-tone signal, their operating bandwidth does not increase. As a result, the operating bandwidths of the hardware modules in the transmitter do not increase. In addition, the present invention can prevent an increase in non-linearity because the operating bandwidths do not increase during implementation of the bias modulator in which the digital-to-analog converter and the switching elements are included in the transmitter.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for amplifying signal power by a transmitter including a first power amplifier and a second power amplifier in a communication system, the method comprising:
generating a baseband signal and a single-tone signal;
generating a positive bias signal by swinging a positive voltage component of the baseband signal; and
generating a negative bias signal by swinging a negative voltage component of the baseband signal,
power-amplifying, at the first power amplifier, the single-tone signal using the positive bias signal, and power-amplifying, at the second power amplifier, the single-tone signal using the negative bias signal.

2. The method of claim 1, further comprising:
converting the generated single-tone signal into an analog signal;
modulating the analog-converted single-tone signal with a high-frequency signal; and
power-amplifying the modulated signal at the first power amplifier and the second power amplifier.

3. The method of claim 1, further comprising:
converting the generated baseband signal into an analog signal;
generating a pulse width modulated signal by pulse-width-modulating the analog-converted baseband signal;
generating a positive bias signal and a negative bias signal, each of which swings from a positive bias voltage to a negative bias voltage, using the pulse width modulated signal; and
switching the generated positive bias signal to a positive bias terminal of the first power amplifier, and switching the gene rated negative bias signal to a negative bias terminal of the second power amplifier.

4. The method of claim 3, further comprising:
generating a positive bias power by low-pass filtering the switched positive bias signal, outputting the generated positive bias power to the first power amplifier, generating a negative bias power by low-pass filtering the switched negative bias signal, and outputting the generated negative bias power to the second power amplifier.

5. The method of claim 1, further comprising:
converting the generated baseband signal into an analog signal;
generating a pulse width modulated signal by pulse-width-modulating the analog-converted baseband signal;
converting the pulse width modulated signal into serial-to-parallel;
generating a positive bias signal and a negative bias signal, each of which swings from a positive bias voltage to a negative bias voltage, using each of the pulse width modulated signals converted serial-to-parallel; and
switching the generated positive bias signal to a positive bias terminal of the first power amplifier, and switching the gene rated negative bias signal to a negative bias terminal of the second power amplifier.

6. The method of claim 5, further comprising:
generating a positive bias power by low-pass filtering the switched positive bias signal, outputting the generated positive bias power to the first power amplifier, generating a negative bias power by low-pass filtering the switched negative bias signal, and outputting the generated negative bias power to the second power amplifier.

7. An apparatus for amplifying signal power in a communication system, the apparatus comprising:
a single-tone signal generator for generating a single-tone signal;
a baseband signal generator for generating a baseband signal;
a bias modulator for switching a positive bias signal to a first power amplifier using the baseband signal, and switching a negative bias signal to the second power amplifier using the baseband signal;
the first power amplifier for power-amplifying the single-tone signal using the positive bias signal; and
the second power amplifier for power-amplifying the single-tone signal using the negative bias signal.

8. The apparatus of claim 7, further comprising:
a digital-to-analog converter for converting each of the generated single-tone signal and the generated baseband signal into an analog signal.

9. The apparatus of claim 8, further comprising:
a carrier modulator for modulating the analog-converted single-tone signal with a high-frequency signal, and outputting the modulated signal to the first power amplifier and the second power amplifier.

10. The apparatus of claim 8, wherein the bias modulator comprises:
a pulse width modulation signal generator for generating a pulse width modulated signal by pulse-width-modulating the analog-converted baseband signal;

a high-side switch for switching a positive bias signal to a positive bias terminal of the first power amplifier using the pulse width modulated signal; and a low-side switch for switching a negative bias signal to a negative bias terminal of the second power amplifier using the pulse width modulated signal.

11. The apparatus of claim 10, wherein the bias modulator further comprises:

a low-pass filter for generating a positive bias power by low-pass filtering the switched positive bias signal, outputting the generated positive bias power to the first power amplifier, generating a negative bias power by low-pass filtering the switched negative bias signal, and outputting the generated negative bias power to the second power amplifier.

12. The apparatus of claim 8, wherein the bias modulator further comprises:

a pulse width modulation signal generator for generating a pulse width modulated signal by pulse-width-modulating the analog-converted baseband signal;

a serial-to-parallel converter for converting the pulse width modulated signal into serial-to-parallel;

a high-side switch for switching a positive bias signal to a positive bias terminal of the first power amplifier using the pulse width modulated signal converted serial-to-parallel; and a low-side switch for switching a negative bias signal to a negative bias terminal of the second power amplifier using the pulse width modulated signal converted serial-to-parallel.

13. The apparatus of claim 12, wherein the bias modulator further comprises:

a low-pass filter for generating a positive bias power by low-pass filtering the switched positive bias signal, outputting the generated positive bias power to the first power amplifier, generating a negative bias power by low-pass filtering the switched negative bias signal, and outputting the generated negative bias power to the second power amplifier.

* * * * *